United States Patent
Hu et al.

(10) Patent No.: US 10,660,218 B2
(45) Date of Patent: May 19, 2020

(54) METHOD OF MANUFACTURING MULTILAYER CIRCUIT BOARD

(71) Applicants: HongQiSheng Precision Electronics (QinHuangDao) Co.,Ltd., Qinhuangdao (CN); Avary Holding (Shenzhen) Co., Limited., Shenzhen (CN)

(72) Inventors: Xian-Qin Hu, Qinhuangdao (CN); Li-Kun Liu, Qinhuangdao (CN); Yan-Lu Li, Qinhuangdao (CN); Ming-Jaan Ho, Tu-Cheng (TW)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 15/957,875

(22) Filed: Apr. 19, 2018

(65) Prior Publication Data
US 2019/0289724 A1    Sep. 19, 2019

(30) Foreign Application Priority Data
Mar. 16, 2018    (CN) .......................... 2018 1 0218827

(51) Int. Cl.
*H05K 3/46*     (2006.01)
*H05K 3/00*     (2006.01)
(Continued)

(52) U.S. Cl.
CPC ......... *H05K 3/4635* (2013.01); *H01L 21/481* (2013.01); *H01L 21/4857* (2013.01); *H01L 23/4985* (2013.01); *H01L 23/49822* (2013.01); *H05K 1/115* (2013.01); *H05K 1/186* (2013.01); *H05K 1/189* (2013.01); *H05K 3/0052* (2013.01);
(Continued)

(58) Field of Classification Search
CPC ....... H05K 3/4602; H05K 3/4611–462; H05K 3/0097; H05K 3/0052
See application file for complete search history.

(56) References Cited

U.S. PATENT DOCUMENTS 5,773,764 A * 6/1998 von Vajna .......... G01R 31/2818
                                                 174/250
6,580,036 B2 * 6/2003 Kim ..................... H05K 3/4623
                                                 174/261
(Continued)

FOREIGN PATENT DOCUMENTS

TW         201006334 A       2/2010

*Primary Examiner* — Livius R. Cazan
(74) *Attorney, Agent, or Firm* — ScienBiziP, P.C.

(57) ABSTRACT

A multilayer circuit board comprises an inner circuit unit having at least one solder portion, and at least one outer circuit board coupled with the inner circuit unit. The inner circuit unit connects with the outer circuit board by an insulation colloid. At least one side of the inner circuit unit does not extend to edges of the multilayer circuit board. The at least one outer circuit board forms at least one through-hole and at least one conductive hole. The at least one conductive hole which is internally-plated with copper extends from the at least one outer circuit board to the inner circuit unit. A method of manufacturing the multilayer circuit board is also disclosed.

10 Claims, 5 Drawing Sheets

(51) Int. Cl.
  *H05K 3/42* (2006.01)
  *H01L 23/498* (2006.01)
  *H05K 1/18* (2006.01)
  *H01L 21/48* (2006.01)
  *H05K 1/11* (2006.01)
  *H05K 3/28* (2006.01)
  *H05K 3/06* (2006.01)

(52) U.S. Cl.
  CPC ............... *H05K 3/285* (2013.01); *H05K 3/42* (2013.01); *H05K 3/4602* (2013.01); *H05K 3/4697* (2013.01); *H01L 23/49827* (2013.01); *H05K 3/06* (2013.01); *H05K 2201/058* (2013.01); *H05K 2201/09063* (2013.01); *H05K 2201/09509* (2013.01); *H05K 2201/10378* (2013.01); *H05K 2203/0228* (2013.01)

(56) References Cited

U.S. PATENT DOCUMENTS

| | | | |
|---|---|---|---|
| 2003/0003706 A1* | 1/2003 | Suzuki | H01L 21/4853 |
| | | | 438/613 |
| 2006/0180344 A1 | 8/2006 | Ito et al. | |
| 2006/0226537 A1 | 10/2006 | Okabe et al. | |
| 2007/0176613 A1 | 8/2007 | Ogawa et al. | |
| 2009/0283312 A1* | 11/2009 | Takahashi | H01L 24/24 |
| | | | 174/260 |

* cited by examiner

METHOD OF MANUFACTURING MULTILAYER CIRCUIT BOARD

CROSS-REFERENCE TO RELATED APPLICATIONS

This application claims priority to Chinese Patent Application No. 201810218827.8 filed on Mar. 16, 2018, the contents of which are incorporated by reference herein.

FIELD

The subject matter herein generally relates to a circuit, especially relates to a multilayer circuit board and method of manufacturing the same.

BACKGROUND

Electronic devices have a bigger screen and are thinner. So Chip On Flex (COF) with fine lines and good flexible is widely used in the electronic device.

COF is difficult to connect with Surface Mount Technology (SMT). The COF can be combined with at least one flexible circuit board, and when the COF is combined with a flexible circuit board, the COF is manufactured to have a size correspondingly to the flexible board. However, the COF has only some of the fine conductive lines coupled with the flexible circuit board. The COF in this usage thus has a lower use ratio when combined with the flexible circuit.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts through the several views.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts have been exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series and the like. The term "coupled" is defined as connected, whether directly or indirectly through intervening components, and is not necessarily limited to physical connections. The connection can be such that the objects are permanently connected or releasably connected.

Figure 1:
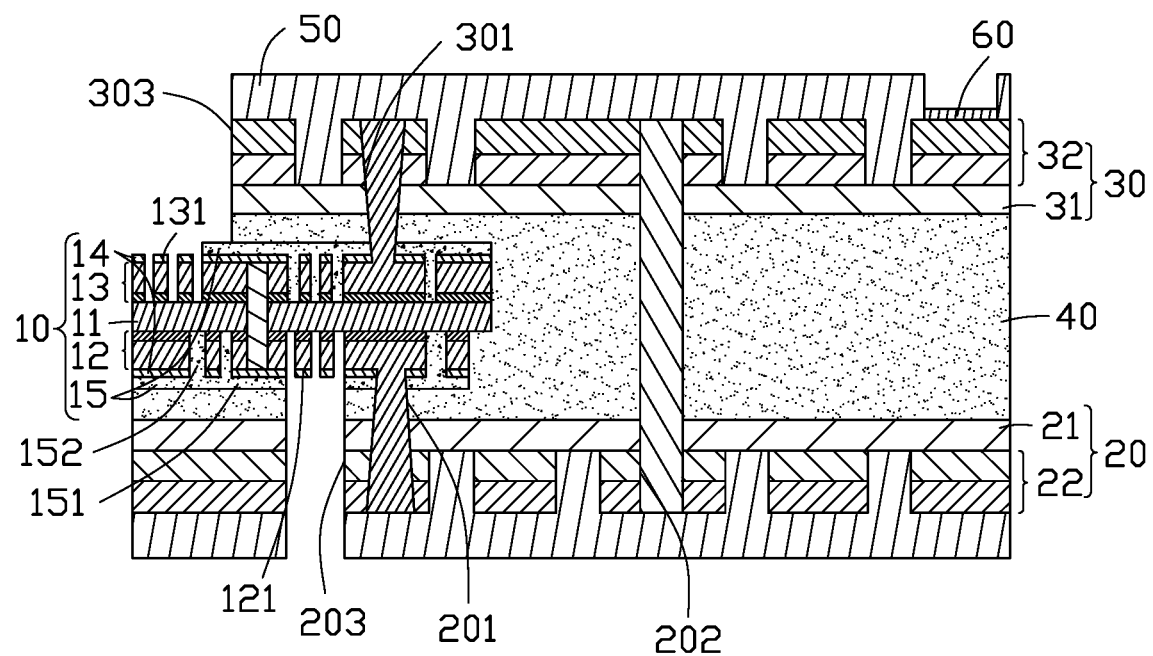
FIG. 1 is a cross-sectional view of a multilayer circuit board of the present disclosure.

Referring to FIG. 1, the multilayer circuit board 100 of the present disclosure includes an inner circuit unit 10, a first outer circuit board 20 and a second outer circuit board 30. The inner circuit unit 10 connects with the first outer circuit board 20 and the second outer circuit board 30 by an insulation colloid 40.

In an exemplary embodiment, the inner circuit unit 10 is a COF. The first outer circuit board 20 and the second outer circuit board 30 are flexible circuit boards.

The inner circuit unit 10 can be coupled with an end of the first outer circuit board 20 on one side and an end of the second outer circuit board 30 on the opposite side. At least one side of the inner circuit unit 10 does not extend to edges of the multilayer circuit board 100.

The inner circuit unit 10 includes an insulation layer 11, a first inner conductive layer 12 and a second inner conductive layer 13. The first inner conductive layer 12 and the second inner conductive layer 13 can be formed on opposite sides of the insulation layer 11. The first inner conductive layer 12 and the second inner conductive layer 13 can be metal. In an exemplary embodiment, the first inner conductive layer 12 and the second inner conductive layer 13 are made of copper.

The first inner conductive layer 12 forms at least one first solder portion 121. The second inner conductive layer 13 forms at least one second solder portion 131. The first solder portion 121 is exposed to the first outer circuit board 20. The second solder portion 131 is exposed to the second outer circuit board 30.

The inner circuit unit 10 further includes a first protection layer 14. The first protection layer is formed on an outer surface of the first inner conductive layer 12 and an outer surface of the second inner conductive layer 13. Thus, the first protection layer 14 covers the first inner conductive layer 12 and the second inner conductive layer 13. The first protection layer 14 can prevents the first solder portion 121 and the second solder portion 131 from oxidizing and increases a reliability of the inner circuit unit 10. In the exemplary embodiment, the first protection layer 14 is made of the tin.

Further, the inner circuit unit 10 includes a first covering layer 15. The first covering layer 15 includes a main portion 151 and a plurality of extending portions 152. The main portion 151 is formed on an outer surface of the first protection layer 14. The plurality of extending portions 152 extend vertically from the main portion 151 to the first inner conductive layer 12 and the second inner conductive layer 13.

The first outer circuit board 20 includes a first insulation layer 21 and a first outer circuit layer 22 formed on a side of the first insulation layer 21. The insulation colloid 40 connects the first insulation layer 21 and the first inner conductive layer 12.

Further, the first outer circuit board 20 forms a first conductive hole 201 and a second conductive hole 202. The first conductive hole 201 extends from the first outer circuit board 20 to the first inner conductive layer 12 of the inner circuit unit 10. The second conductive hole 202 extends through the first outer circuit board 20, the insulation colloid 40 and the second outer circuit board 30. The inner circuit unit 10 is located on one side of the second conductive hole 202.

Further, the first outer circuit board 20 forms a first through-hole 203. The first solder portion 121 is exposed to the first through-hole 203.

The second outer circuit board 30 includes a second insulation layer 31 and a second outer circuit layer 32 formed on a side of the second insulation layer 31. The insulation colloid 40 connects with the second insulation layer 31 and the second inner conductive layer 13.

The second outer circuit board 30 forms a third conductive hole 301 corresponding to the first conductive hole 201. The third conductive hole 301 extends from the second outer circuit board 30 to the second inner conductive layer 13 of the inner circuit unit 10.

Further, the first conductive hole 201, a second conductive hole 202 and the third conductive hole 301 are plated with metal for connecting electrically with the inner circuit unit 10, the first outer circuit board 20 and the second outer circuit board 30. In an exemplary embodiment, the metal is copper.

Further, the second outer circuit board 30 forms a second through-hole 303. The second solder portion 131 is exposed to the second through-hole 303.

Further, the multilayer circuit board 100 includes a second covering layer 50 and a second protection layer 60. The second covering layer 50 and the second protection layer 60 are formed on an outer surface of the first outer circuit board 20 and an outer surface of the second outer circuit board 30. The second covering layer 50 and the second protection layer 60 protect the first outer circuit board 20 and the second outer circuit board 30 from oxidizing and enhances a stability of the multilayer circuit board 100. In the exemplary embodiment, the second covering layer 50 is made of CVL, PiCL or ink etc. The second protection layer 60 is made of gold.

Figure 2:
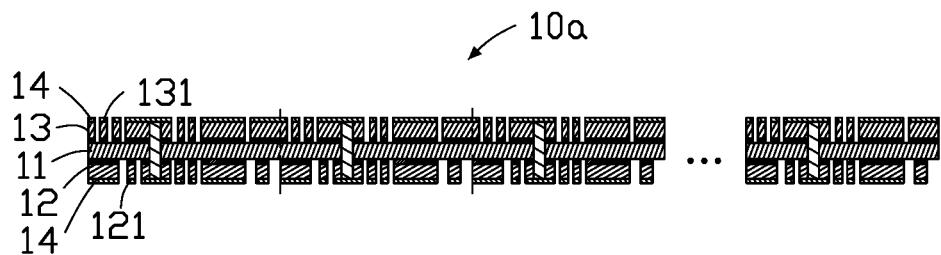
FIGS. 2-11 are cross-sectional views of illustrating a multilayer circuit board, illustrating respective steps of a method of manufacturing the same in according with the multilayer circuit board of FIG. 1.

Referring to FIGS. 2-11, a method for manufacturing the multilayer circuit board 100 includes the following steps:

First step, referring to FIG. 2, providing an inner circuit board 10a and forming a first protection layer 14 on the outer surface of the inner circuit board 10a.

The inner circuit board 10a includes an insulation layer 11, and a first inner conductive layer 12 and a second inner conductive layer 13 formed on opposite sides of the insulation layer 11. The first inner conductive layer 12 forms at least one first solder portion 121. The second inner conductive layer 13 forms at least one second solder portion 131. The first protection layer 14 covers the first inner conductive layer 12 and the second inner conductive layer 13. In the exemplary embodiment, the first protection layer 14 is made of the tin.

Figure 3:
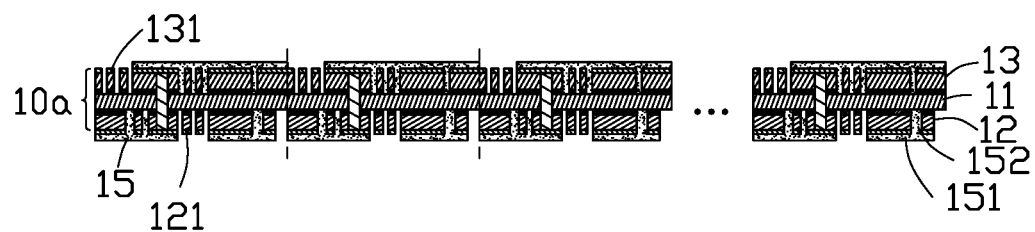

Second step, referring to FIG. 3, forming a first covering layer 15 on the first protection layer 14.

The first covering layer 15 includes a main portion 151 and a plurality of extending portions 152. The main portion 151 is formed on an outer surface of the first protection layer 14. The plurality of extending portions 152 extend vertically from the main portion 151 to the first inner conductive layer 12 and the second inner conductive layer 13.

Figure 4:
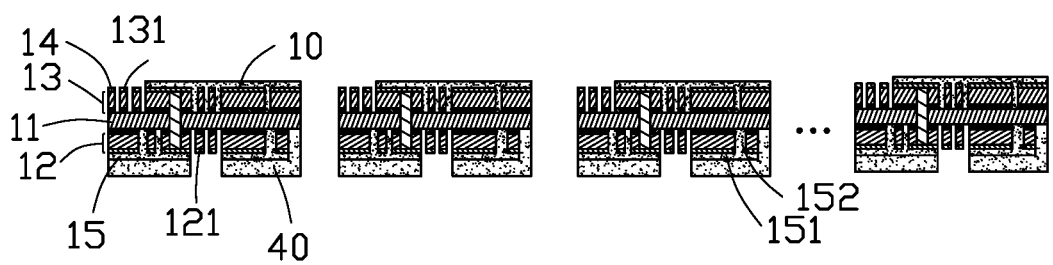

Third step, referring to FIG. 4, covering a side of the inner circuit board 10a with an insulation colloid 40, and cutting the inner circuit board 10a into multiple inner circuit units 10.

Generally, the insulation colloid 40 is on the first inner conductive layer 12 of the inner circuit unit 10. The first solder portion 121 is exposed from the insulation colloid 40.

Figure 5:
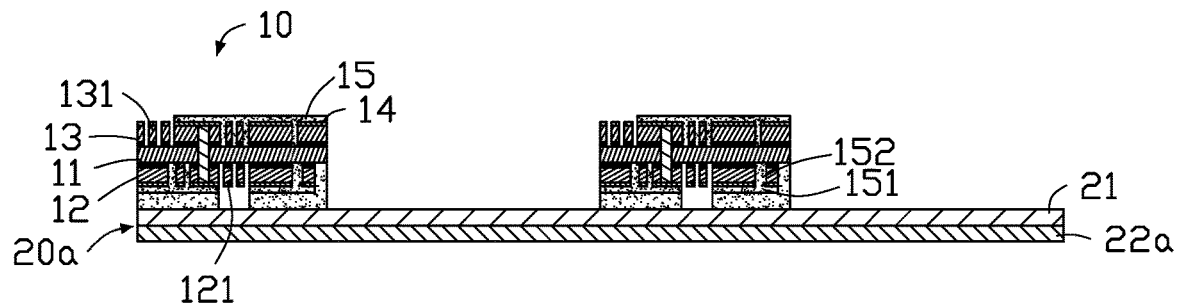

Fourth step, referring to FIG. 5, providing a first outer substrate 20a, and pasting the inner circuit unit 10 on the outer substrate 20a by the insulation colloid 40.

The first outer substrate 20a includes a first insulation layer 21 and a first outer conductive layer 22a formed on a side of the first insulation layer 21. The insulation colloid 40 connects the first inner conductive layer 12 of the inner circuit unit 10 and the first insulation layer 21 of the first outer substrate 20a.

Figure 6:
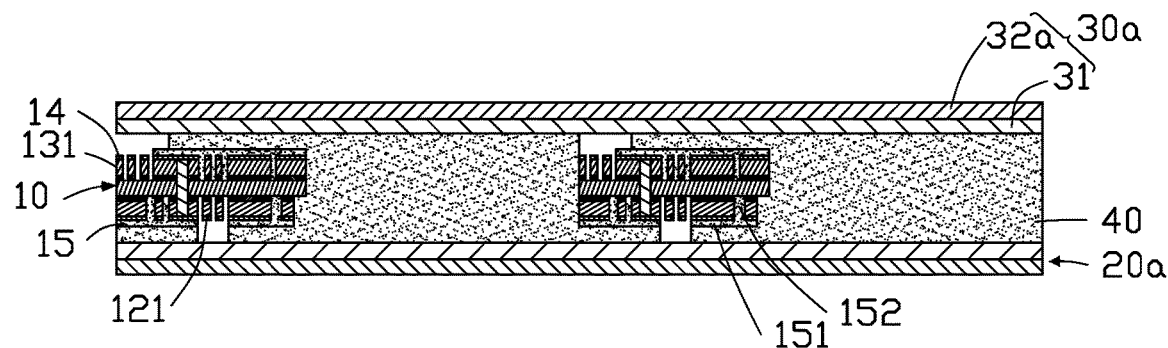

Fifth step, referring to FIG. 6, providing a second outer substrate 30a and pasting the outer substrate 30a on another side of the inner circuit unit 10 by the insulation colloid 40.

The second outer substrate 30a includes a second insulation layer 31 and a second outer conductive layer 32a formed on the second insulation layer 31. The insulation colloid 40 connects the second inner conductive layer 13 of the inner circuit unit 10 and the second insulation layer 31 of the outer substrate 30a. The insulation colloid 40 further covers the first inner circuit unit 10 and fills the space defined between the first outer substrate 20a and the second outer substrate 30a. The second solder portion 131 is exposed from the insulation colloid 40.

Figure 7:
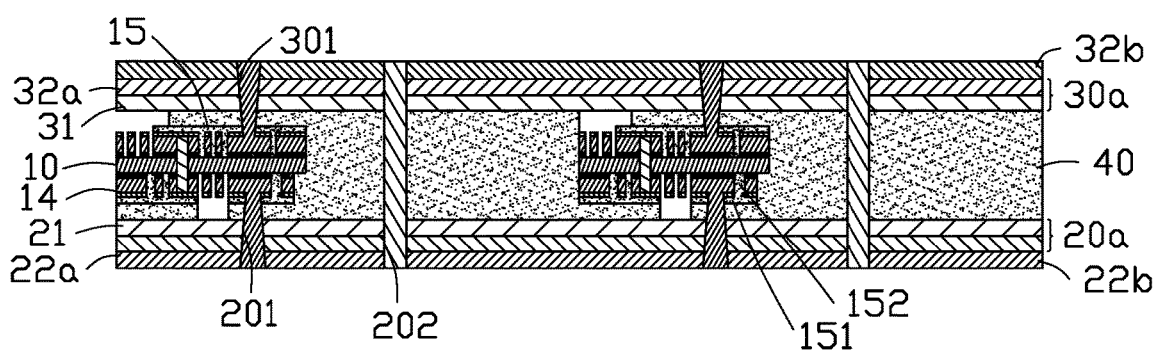

Sixth step, referring to FIG. 7, electrically coupling the inner circuit unit 10, the first outer substrate 20a, and the second outer substrate 30a.

In an exemplary embodiment, the first outer substrate 20a forms a first conductive hole 201 and a second conductive hole 202. The second outer substrate 30a forms a third conductive hole 301 corresponding to the first conductive hole 201. The first conductive hole 201 extends from the first outer substrate 20a to the first inner conductive layer 12 of the inner circuit unit 10. The second conductive hole 202 extends through the first outer substrate 20a, the insulation colloid 40, and the second outer substrate 30a. The third conductive hole 301 extends from the second outer substrate 30a to the second inner conductive layer 13 of the inner circuit unit 10. The first conductive hole 201, a second conductive hole 202 and the third conductive hole 301 are internally plated with copper. A first copper foil 22b is formed on an outer surface of the first outer substrate 20a. A second copper foil 32b is formed on an outer surface of the second outer substrate 30a. The first outer substrate 20a is coupled with the inner circuit unit 10 by the internally-plated first conductive hole 201. The first outer substrate 20a is coupled with the second outer substrate 30a by the internally-plated second conductive hole 202. The second outer substrate 30a is coupled with the inner circuit unit 10 by the internally-plated third conductive hole 301. It can be understood that electrically coupling of the inner circuit unit 10 the first outer substrate 20a and the second outer substrate 30a is by conductive paste.

Figure 8:
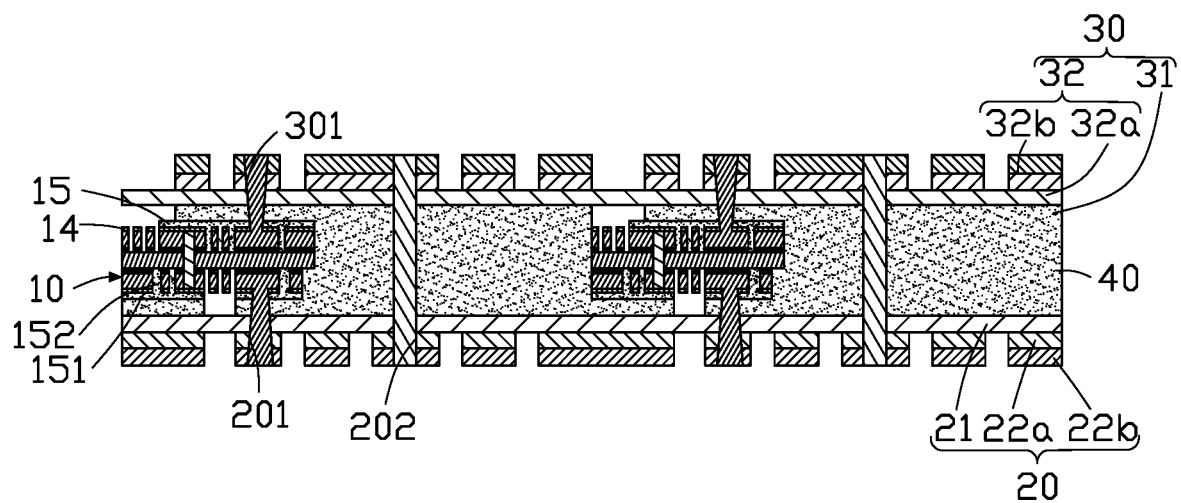

Seventh step, referring to FIG. 8, etching the first outer substrate 20a and the second outer substrate 30a to form a first outer circuit board 20 and a second outer circuit board 30.

Generally step, the first outer circuit board 20 is formed by etching the first outer conductive layer 22a and the first copper foil 22b. The first outer circuit board 20 includes the first insulation layer 21 and the first outer circuit layer 22 making up the first conductive layer 22a and the first copper foil 22b. The second outer circuit board 30 is formed by etching the second outer conductive layer 32a and the second copper foil 32b. The second outer circuit board 30 includes the second insulation layer 31 and the second outer circuit layer 32 making up of the second outer conductive layer 32a and the second copper foil 32b.

Figure 9:
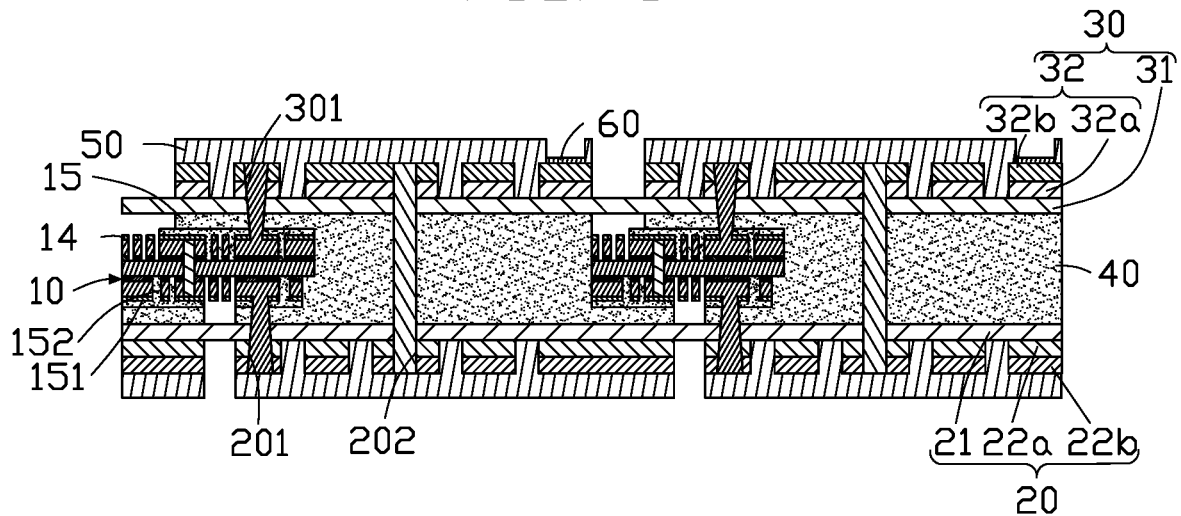

Eighth step, referring to FIG. 9, forming a second covering layer 50 and a second protection layer 60 on an outer surface of the first outer circuit board 20 and an outer surface of the second outer circuit board 30.

In the exemplary embodiment, the second covering layer 50 is made of CVL, PiCL or ink etc. The second protection layer 60 is made of gold.

Figure 10:
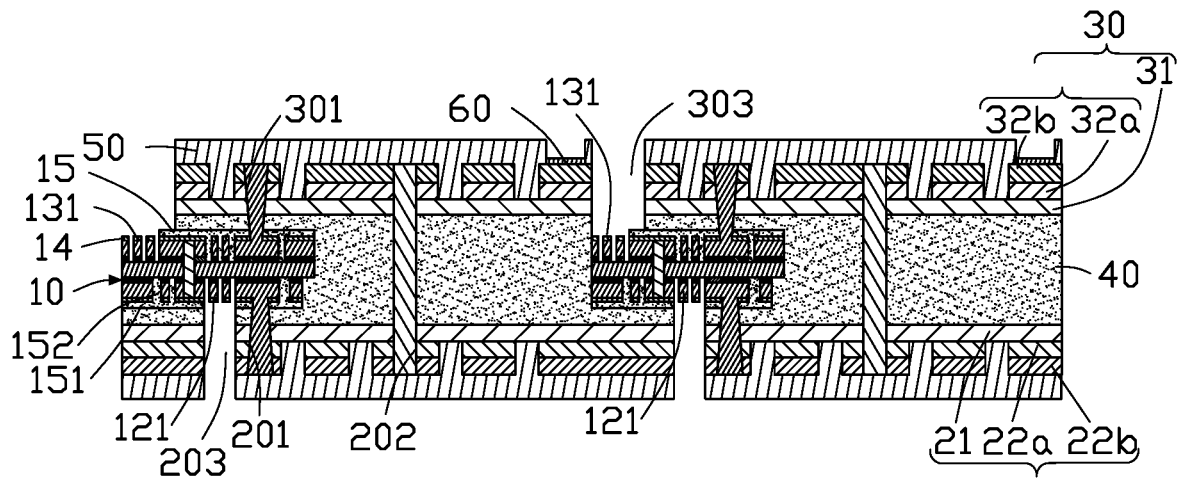

Ninth step, referring to FIG. 10, forming a first through-hole 203 on the first outer circuit board 20 to expose the first solder portion 121, and forming a second through-hole 303 on the second outer circuit board 30 to expose the second solder portion 131.

Figure 11:
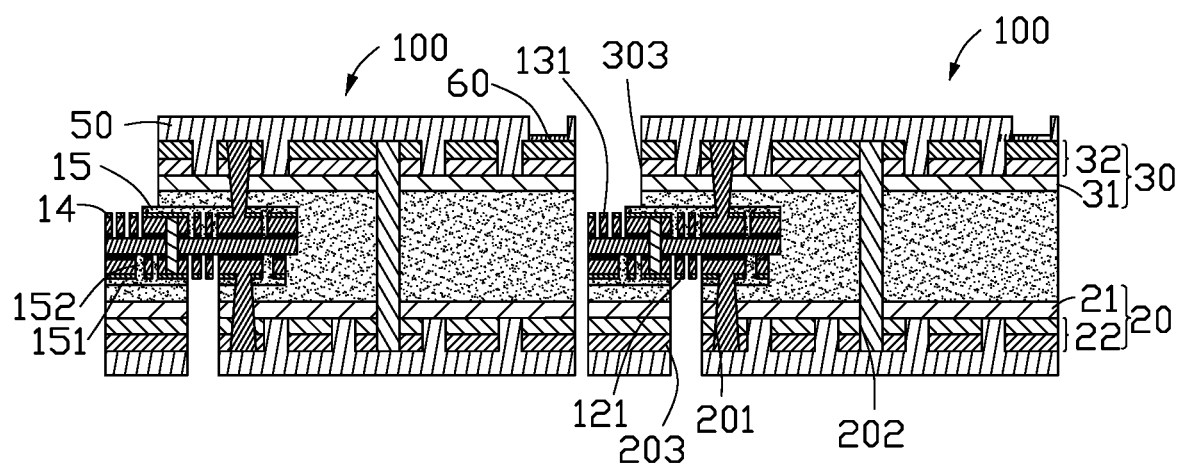

Tenth step, referring to FIG. 11, vertically cutting the second outer circuit board 30 and the first outer circuit board 20 to achieve multiple multilayer circuit boards 100.

At least one side of the inner circuit unit 10 does not extend to edges of the multilayer circuit board 100.

In the method for manufacturing the multilayer circuit board 100 of the present disclosure, the inner circuit board 10a is cut into multiple inner circuit units 10 to connect with the first outer circuit board 20 and the second outer circuit board 30. Thus, when only one inner circuit unit is damaged, the first outer circuit board 20 and the second outer circuit board 30 do not also need to be scraped, avoiding waste. The layout between the inner circuit unit 10 and the first outer circuit board 20 and the second outer circuit board 30 becomes more flexible. Utilization of the inner circuit unit, the first outer circuit board and the second outer circuit board are improved. Further, the inner circuit unit 10, the first outer circuit board 20 and the second outer circuit board 30 are electrically connected by the first conductive hole 201, the second conductive hole 202, and the third conductive hole 301, to enhance stability of the electrical connection of multilayer circuit board 100 is good.

The embodiments shown and described above are only examples. Many details are often found in the art such as the other features of a multilayer circuit board and method of manufacturing the same. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including the full extent established by the broad general meaning of the terms used in the claims. It will therefore be appreciated that the embodiments described above can be modified within the scope of the claims.

What is claimed is:

1. A method of manufacturing a plurality of multilayer circuit boards comprising the steps of:
providing an inner circuit board, the inner circuit board having at least one solder portion; forming a first protection layer on the at least one solder portion;
forming a first covering layer on the first protection layer;
covering the inner circuit board with an insulation adhesive;
vertically cutting the inner circuit board into a plurality of inner circuit units;
providing at least one outer substrate and pasting at least two of the plurality of inner circuit units with at the least one outer substrate by the insulation adhesive;
electrically coupling the at least two of the plurality of inner circuit units and the at least one outer substrate;
etching the at least one outer substrate to form an outer circuit board;
forming a second covering layer and a second protection layer on an outer surface of the outer circuit board;
forming at least one through-hole on the outer circuit board to expose the at least one solder portion; and
vertically cutting the outer circuit board to form the plurality of multilayer circuit boards, at least one side of each of the at least two of the plurality of inner circuit units does not extend to edges of the multilayer circuit board.

2. The method of claim 1, wherein each of the at least two of the plurality of inner circuit units comprises an insulation layer, a first inner conductive layer and a second inner conductive layer formed on opposite sides of the insulation layer.

3. The method of claim 2, wherein the at least one outer substrate comprises a first outer substrate connected with the first inner conductive layer and a second outer substrate connected with the second inner conductive layer.

4. The method of claim 3, wherein the first outer substrate comprises a first insulation layer and a first outer conductive layer formed on the first insulation layer, the second outer substrate comprises a second insulation layer and a second outer conductive layer formed on the second insulation layer, the insulation adhesive is coupled with the first inner conductive layer and the first insulation layer, and also coupled with the second inner conductive layer and the second insulation layer.

5. The method of claim 4, wherein each of the at least two of the plurality of inner circuit units is coupled with the first outer substrate and the second outer substrate by plating copper in at least one conductive hole formed in the first outer substrate and the second substrate.

6. The method of claim 5, wherein the conductive hole comprises a first conductive hole and a second conductive hole formed in the first outer substrate, and a third conductive hole formed in the second outer substrate, the first conductive hole.

7. The method of claim 6, wherein before etching the at least one outer substrate to form an outer circuit board, further comprising forming a first copper foil on the first outer substrate and forming a second copper foil on the second outer substrate.

8. The method of claim 7, wherein etching the at least one outer substrate to form an outer circuit board comprises forming a first outer circuit board by etching the first outer conductive layer and the first copper foil, and forming a second outer circuit board by etching the second outer conductive layer and the second copper foil.

9. The method of claim 8, wherein the first protection layer covers the first inner conductive layer and the second inner conductive layer, the first covering layer comprises a main portion and a plurality of extending portions, the main portion is formed on an outer surface of the first protection layer, the plurality of extending portions extend vertically from the main portion to the first inner conductive layer and the second inner conductive layer.

10. The method of claim 1, wherein the second covering layer is a cover layer or made of ink, and the second protection layer is made of gold.

* * * * *